(12) United States Patent
Takata

(10) Patent No.: US 12,261,590 B2
(45) Date of Patent: Mar. 25, 2025

(54) ACOUSTIC WAVE FILTER, HIGH FREQUENCY MODULE, AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 206 days.

(21) Appl. No.: 18/096,617

(22) Filed: Jan. 13, 2023

(65) Prior Publication Data

US 2023/0170879 A1   Jun. 1, 2023

Related U.S. Application Data

(63) Continuation of application No. PCT/JP2021/027059, filed on Jul. 20, 2021.

(30) Foreign Application Priority Data

Jul. 22, 2020  (JP) .................. 2020-125789

(51) Int. Cl.
*H03H 9/58*  (2006.01)
*H03H 9/13*  (2006.01)
(Continued)

(52) U.S. Cl.
CPC .............. *H03H 9/58* (2013.01); *H03H 9/133* (2013.01); *H03H 9/205* (2013.01); *H03H 9/70* (2013.01)

(58) Field of Classification Search
CPC .......... H03H 9/58; H03H 9/133; H03H 9/205; H03H 9/70; H03H 9/6436; H03H 9/725;
(Continued)

(56) References Cited

U.S. PATENT DOCUMENTS 8,269,577 B2 *  9/2012  Inoue ............... H03H 9/725
                                              333/194
2017/0272057 A1  9/2017  Takata
(Continued)

FOREIGN PATENT DOCUMENTS

JP       11312951 A     11/1999
WO    2016088680 A1      6/2016
(Continued)

OTHER PUBLICATIONS

International Search Report in PCT/JP2021/027059, mailed Oct. 12, 2021, 3 pages.
(Continued)

*Primary Examiner* — Jorge L Salazar, Jr.
(74) *Attorney, Agent, or Firm* — Keating & Bennett, LLP

(57) ABSTRACT

A filter includes a series resonator or a longitudinally coupled resonator on a path connecting a first input-and-output terminal and a second input-and-output terminal, and parallel resonators each connected between the path and a ground. Among the parallel resonators, a second parallel resonator and a first parallel resonator are connected in parallel without another resonator being interposed therebetween. An IDT electrode of the first parallel resonator includes different electrode finger pitches. An average of all the electrode finger pitches of the IDT electrode of the first parallel resonator is larger than an average of all the electrode finger pitches of an IDT electrode of the second parallel resonator.

20 Claims, 7 Drawing Sheets

(51) Int. Cl.
*H03H 9/205* (2006.01)
*H03H 9/70* (2006.01)

(58) Field of Classification Search
CPC ............... H03H 9/6483; H03H 9/1455; H03H 9/14541; H03H 9/64
USPC .......................................... 333/133, 193–196
See application file for complete search history.

(56) References Cited

U.S. PATENT DOCUMENTS

| | | |
|---|---|---|
| 2019/0036554 A1 | 1/2019 | Ito et al. |
| 2019/0190494 A1 | 6/2019 | Nosaka |
| 2020/0304102 A1 | 9/2020 | Kanazawa |

FOREIGN PATENT DOCUMENTS

| | | |
|---|---|---|
| WO | 2017131170 A1 | 8/2017 |
| WO | 2018043607 A1 | 3/2018 |
| WO | 2019117133 A1 | 6/2019 |

OTHER PUBLICATIONS

Written Opinion in PCT/JP2021/027059, mailed Oct. 12, 2021 3 pages.

\* cited by examiner

ACOUSTIC WAVE FILTER, HIGH FREQUENCY MODULE, AND MULTIPLEXER

CROSS REFERENCE TO RELATED APPLICATIONS

This application claims the benefit of priority to Japanese Patent Application No. 2020-125789 filed on Jul. 22, 2020 and is a Continuation Application of PCT Application No. PCT/JP2021/027059 filed on Jul. 20, 2021. The entire contents of each application are hereby incorporated herein by reference.

BACKGROUND OF THE INVENTION

1. Field of the Invention

The present invention relates to an acoustic wave filter, a high frequency module, and a multiplexer.

2. Description of the Related Art

Conventionally, an acoustic wave filter provided with parallel resonators which are divided in parallel has been disclosed (for example, in Japanese Unexamined Patent Application Publication No. 11-312951). The parallelly divided parallel resonators have resonant frequencies different from each other. Thus, sharpness of a transition band from a pass band to a stop band is large, and an acoustic wave filter with a narrow pass band can be achieved.

SUMMARY OF THE INVENTION

An acoustic wave resonator is inductive in a frequency band between a resonant frequency and an anti-resonant frequency thereof, and is capacitive in a frequency band lower than the resonant frequency and in a frequency band higher than the anti-resonant frequency. Therefore, in Japanese Unexamined Patent Application Publication No. 11-312951, in a frequency band between the resonant frequencies of the respective parallelly divided parallel resonators, one parallel resonator becomes capacitive, and the other parallel resonator becomes inductive, thus LC resonance is caused in the frequency band.

In recent years, in communication devices such as cellular phone devices, a multiplexer (duplexer) which isolates (splits) high frequency signals into different frequency bands are widely used so that one device can operate in a plurality of frequency bands and a plurality of wireless systems (that is, a multiband and a multimode), and a plurality of filters are connected in common in the multiplexer. When the LC resonance is caused in one acoustic wave filter in the multiplexer, impedance of the one acoustic wave filter may approach 50Ω in a pass band of another filter which is connected in common to the one acoustic wave filter. Therefore, there is a problem that attenuation of the one acoustic wave filter in its attenuation band corresponding to the pass band of the another filter may decrease.

Therefore, preferred embodiments of the present invention provide acoustic wave filters, high frequency modules, and multiplexers, each achieving a large sharpness of a transition band from a pass band to a stop band and capable of reducing or preventing a decrease in attenuation in an attenuation band corresponding to a pass band of another filter when the acoustic wave filter is connected in common to the another filter.

An acoustic wave filter according to an aspect of a preferred embodiment of the present invention includes a first input-and-output terminal, a second input-and-output terminal, a series resonator or a longitudinally coupled resonator on a path connecting the first input-and-output terminal and the second input-and-output terminal, and a plurality of parallel resonators each connected between the path and a ground. Among the plurality of parallel resonators, a first parallel resonator and a second parallel resonator are connected in parallel without another resonator being interposed therebetween. Each of the first parallel resonator and the second parallel resonator includes an IDT electrode including a plurality of electrode fingers extending in a direction intersecting with a propagation direction of an acoustic wave and parallel or substantially parallel with each other. The IDT electrode of the first parallel resonator has a plurality of electrode finger pitches different from each other. An average of all the electrode finger pitches of the IDT electrode of the first parallel resonator is larger than an average of all electrode finger pitches of the IDT electrode of the second parallel resonator.

A high frequency module according to an aspect of another preferred embodiment of the present invention includes the above-described acoustic wave filter, and an amplifier connected to the first input-and-output terminal.

A multiplexer according to an aspect of an additional preferred embodiment of the present invention includes a common terminal, the above-described acoustic wave filter, and a first filter including a third input-and-output terminal and a fourth input-and-output terminal and having a pass band different from a pass band of the acoustic wave filter. The common terminal is connected to the second input-and-output terminal and the fourth input-and-output terminal.

With the acoustic wave filters, high frequency modules, and multiplexers according to preferred embodiments of the present invention, the sharpness of the transition band from the pass band to the stop band can be large, and a decrease in attenuation in the attenuation band corresponding to the pass band of another filter when the acoustic wave filter is connected in common to the another filter can be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
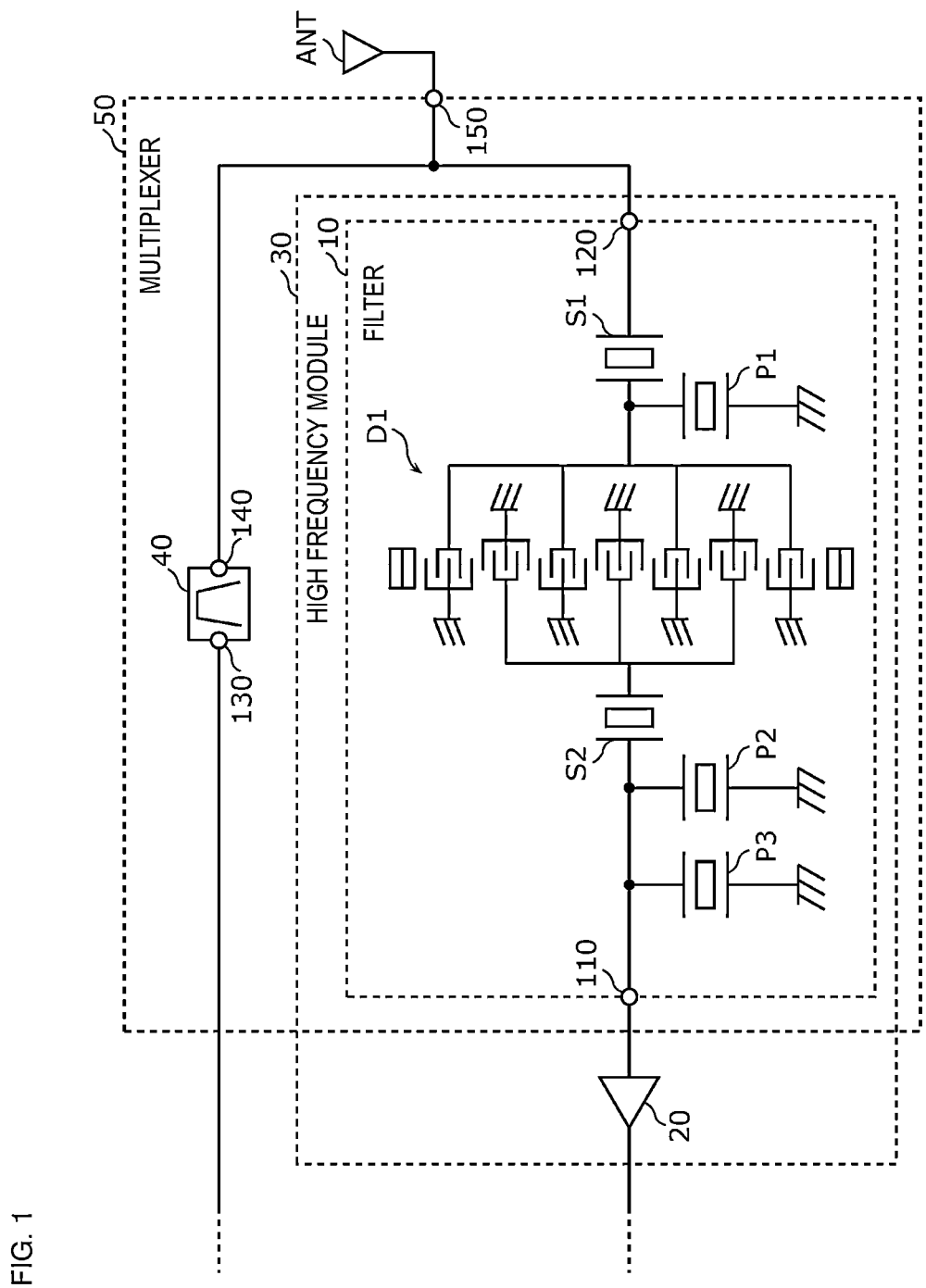
FIG. 1 is a configuration diagram illustrating one example of a multiplexer according to a preferred embodiment of the present invention.

Hereinafter, preferred embodiments of the present invention are described in detail with reference to the drawings. Note that the following preferred embodiments describe comprehensive or concrete examples. Numerical values, shapes, material, components, and arrangement and connection configuration of the components described in the following preferred embodiments are merely examples, and not intended to limit the present invention. Among the components in the following preferred embodiments, components not described in the main claims are described as arbitrary components. Further, the size or a size ratio of the components illustrated in the drawings are not always exact. In the drawings, the same reference characters are given to the substantially same components, and redundant description may be omitted or simplified. Moreover, in the following preferred embodiments, a phrase "be connected" includes not only "be directly connected" but also "be electrically connected with another device etc. being interposed therebetween".

PREFERRED EMBODIMENT

1. Configuration of Multiplexer

FIG. 1 is a configuration diagram illustrating one example of a multiplexer 50 according to a preferred embodiment of the present invention. FIG. 1 also illustrates an antenna device ANT connected to a common terminal 150 of the multiplexer 50 and an amplifier 20 connected to an input-and-output terminal 110 of a filter 10 of the multiplexer 50. The antenna device ANT is, for example, a multiband antenna conforming to the telecommunication standards, such as the long term evolution (LTE). The amplifier 20 is, for example, a low noise amplifier which performs power amplification of high frequency reception signals received by the antenna device ANT. The filter 10 and the amplifier 20 define a high frequency module 30.

The multiplexer 50 is a demultiplexer/multiplexer circuit including an acoustic wave filter. The multiplexer 50 includes the common terminal 150, the filter 10, and a filter 40. The common terminal 150 is connected to an input-and-output terminal 120 provided to the filter 10, and an input-and-output terminal 140 provided to the filter 40.

The common terminal 150 is provided to the filters 10 and 40 in common and is connected to the filters 10 and 40 inside the multiplexer 50. Further, the common terminal 150 is connected to the antenna device ANT outside the multiplexer 50. That is, the common terminal 150 is also an antenna terminal of the multiplexer 50.

The filter 10 is provided with the input-and-output terminals 110 and 120, and the filter 40 is provided with input-and-output terminals 130 and 140. The input-and-output terminal 110 is one example of a first input-and-output terminal, the input-and-output terminal 120 is one example of a second input-and-output terminal, the input-and-output terminal 130 is one example of a third input-and-output terminal, and the input-and-output terminal 140 is one example of a fourth input-and-output terminal. For example, the filter 10 is a reception filter, and in this case, the input-and-output terminal 110 is an output terminal, and the input-and-output terminal 120 is an input terminal. For example, the filter 40 is a transmission filter, and in this case, the input-and-output terminal 130 is an input terminal, and the input-and-output terminal 140 is an output terminal.

The filter 10 is an acoustic wave filter connected in common with the filter 40 in the multiplexer 50. The filter 10 is provided with a series resonator or a longitudinally coupled resonator, and a plurality of parallel resonators. Here, the filter 10 is provided with series resonators S1 and S2, and a longitudinally coupled resonator D1 as the series resonator or the longitudinally coupled resonator, and provided with parallel resonators P1, P2, and P3 as the plurality of parallel resonators. Note that it is not always necessary that the filter 10 includes both of the series resonator and the longitudinally coupled resonator. For example, it is possible that the filter 10 does not have to include one of the series resonators S1 and S2. For example, the filter 10 may be a ladder filter without the longitudinally coupled resonator D1. Moreover, the filter 10 is unnecessarily provided with the parallel resonator P1, as long as it is provided with at least the parallel resonators P2 and P3 as the plurality of parallel resonators.

The series resonator S1 is a series resonator disposed on a path connecting the input-and-output terminal 110 and the input-and-output terminal 120. In detail, the series resonator S1 is disposed between the input-and-output terminal 120 and the longitudinally coupled resonator D1. The series resonator S2 is a series resonator disposed on the path connecting the input-and-output terminal 110 and the input-and-output terminal 120. In detail, the series resonator S2 is disposed between the input-and-output terminal 110 and the longitudinally coupled resonator D1. The longitudinally coupled resonator D1 is a longitudinally coupled resonator disposed on the path connecting the input-and-output terminal 110 and the input-and-output terminal 120. In detail, the longitudinally coupled resonator D1 is disposed between the series resonator S1 and the series resonator S2. For example, the longitudinally coupled resonator D1 is a longitudinally coupled resonator of a seven-electrode type.

Among the plurality of parallel resonators provided to the filter 10, the parallel resonators P2 and P3 are connected in parallel without another resonator being interposed therebetween. The parallel resonator P1 is a parallel resonator connected between a ground and a node on a path connecting the series resonator S1 and the longitudinally coupled resonator D1. The parallel resonator P3 is one example of a first parallel resonator connected between a ground and a node on a path connecting the series resonator S2 and the input-and-output terminal 110. The parallel resonator P2 is one example of a second parallel resonator connected between a ground and the node on the path connecting the series resonator S2 and the input-and-output terminal 110, and connected in parallel with the parallel resonator P3. Each node is a connection point between a device and a device or between a device and a terminal. The node to which the parallel resonator P2 is connected is the same as the node to which the parallel resonator P3 is connected, and the parallel resonator P2 and the parallel resonator P3 are connected in parallel without intervention of another resonator. For example, the parallel resonators P2 and P3 may be divided resonators, and the parallel resonators P2 and P3 may be a single resonator. The series resonators S1 and S2, the parallel resonators P1, P2, and P3, and the longitudinally coupled resonator D1 configure a pass band and an attenuation band of the filter 10. For example, it is designed such that anti-resonant frequencies of the parallel resonators P2 and P3 are positioned in the pass band of the filter 10, and resonant frequencies of the parallel resonators P2 and P3 are positioned at an attenuation pole near a lower side of the pass band. For example, the filter 10 is a reception filter having a pass band in the Band 8 Rx (925-960 MHz) in the LTE.

Each resonator includes an IDT electrode including a plurality of electrode fingers extending in a direction intersecting with a propagation direction of an acoustic wave, and arranged in parallel or substantially in parallel with each other. The IDT electrode of each resonator is located on a substrate having a piezoelectric layer (substrate with piezoelectricity). For example, the substrate with piezoelectricity is a Y-cut LiNbO$_3$ substrate, and each resonator is a surface acoustic wave device of a Rayleigh wave type. Further, a reflector may be provided on the substrate with piezoelectricity to be adjacent to the IDT electrode in the propagation direction of the acoustic wave.

When a distance between the electrode fingers adjacent to each other in the propagation direction of the acoustic wave (in detail, a distance between center lines of the respective electrode fingers) is defined as an electrode finger pitch, the IDT electrode of the parallel resonator P3 has a plurality of electrode finger pitches different from each other. Therefore, a plurality of resonance points are generated in the parallel resonator P3, and the parallel resonator P3 has a plurality of resonant frequencies. Further, an average of all the electrode finger pitches of the IDT electrode of the parallel resonator P3 is larger than an average of all the electrode finger pitches of the IDT electrode of the parallel resonator P2. Therefore, an average frequency of the plurality of resonant frequencies of the parallel resonator P3 is lower than an average frequency of the plurality of resonant frequencies of the parallel resonator P2. The average of all the electrode finger pitches of the IDT electrode is a value obtained by dividing a distance between the centers of the electrode fingers on both ends of the IDT electrode in the propagation direction of the acoustic wave, by a value obtained by subtracting one from the number of electrode fingers of the IDT electrode.

For example, the electrode finger pitches of the IDT electrode of the parallel resonator P2 are constant, and in this case, the average frequency of the plurality of resonant frequencies of the parallel resonator P3 is lower than the resonant frequency of the parallel resonator P2. A case where the IDT electrode of the parallel resonator P3 has a plurality of different electrode finger pitches is described below as an preferred embodiment, and a case where the electrode finger pitches of the IDT electrode of the parallel resonator P3 are constant is described as a comparative example.

The filter 40 includes the input-and-output terminals 130 and 140, and is one example of a first filter having a pass band different from the filter 10. For example, the pass band of the filter 40 is positioned on a lower frequency side of the pass band of the filter 10. The filter 40 may be an acoustic wave filter or an LC filter. For example, the filter 40 may be a transmission filter having a pass band in the Band 8 Tx (880-915 MHz) in the LTE.

Note that the number of filters connected to the common terminal 150 in the multiplexer 50 may be three or more. Further, the multiplexer 50 may be configured only by a plurality of transmission filters or only by a plurality of reception filters.

2. Comparative Example

Next, the comparative example in which the electrode finger pitches of the IDT electrode of the parallel resonator P3 are constant is described.

Table 1 is a table showing parameters of the parallel resonators P1, P2, and P3 in the comparative example.

TABLE 1

| Parallel resonator | Average pitch | Pitch distribution | Electrostatic capacitance |
|---|---|---|---|
| P1 | 1.6778 μm | Constant | 3.06 pF |
| P2 | 1.6759 μm | Constant | 1.17 pF |
| P3 | 1.6892 μm | Constant | 0.51 pF |

As illustrated in Table 1, in the comparative example, an average of all the electrode finger pitches of the IDT electrode of the parallel resonator P1 is 1.6778 μm, distribution of the electrode finger pitches of the IDT electrode of the parallel resonator P1 is constant, and an electrostatic capacitance of the parallel resonator P1 is 3.06 pF. An average of all the electrode finger pitches of the IDT electrode of the parallel resonator P2 is 1.6759 μm, distribution of the electrode finger pitches of the IDT electrode of the parallel resonator P2 is constant, and an electrostatic capacitance of the parallel resonator P2 is 1.17 pF. An average of all the electrode finger pitches of the IDT electrode of the parallel resonator P3 is 1.6892 μm, distribution of the electrode finger pitches of the IDT electrode of the parallel resonator P3 is constant, and an electrostatic capacitance of the parallel resonator P3 is 0.51 pF.

Figure 2:
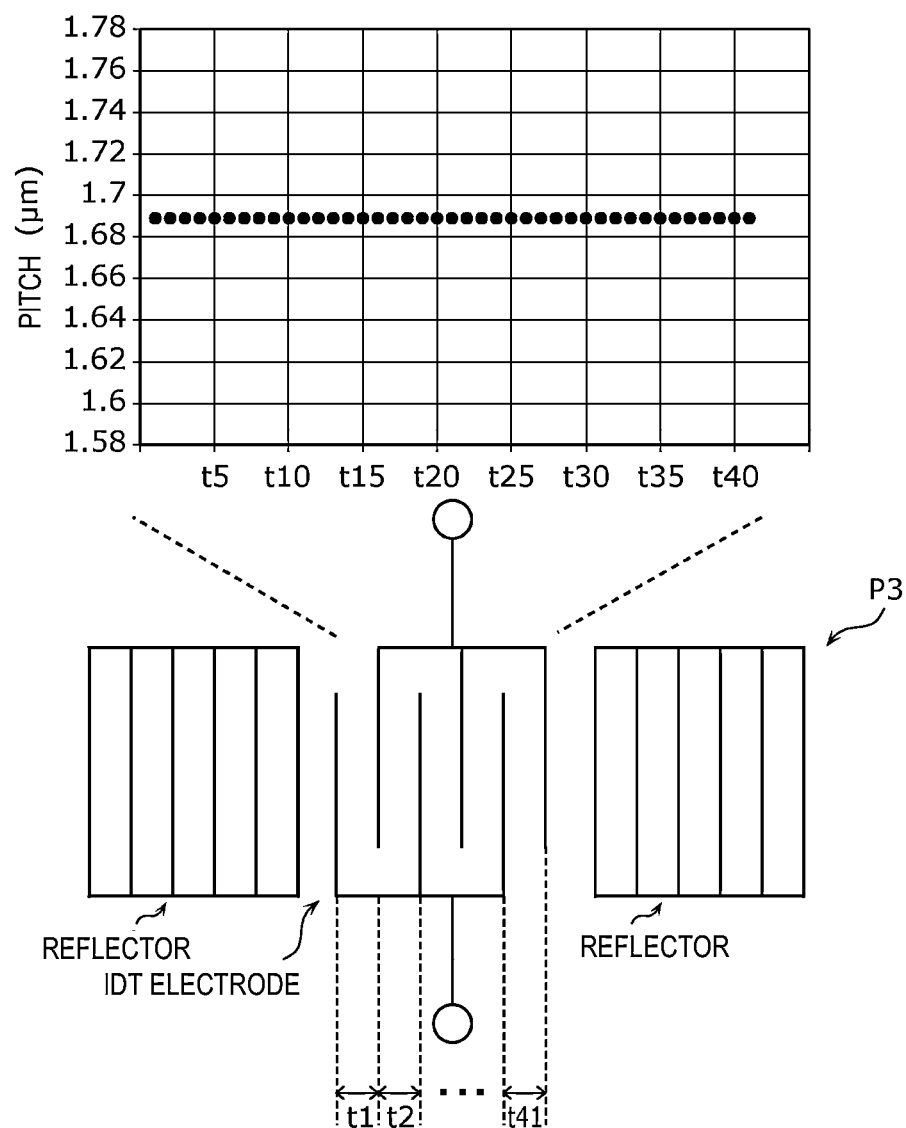
FIG. 2 is a diagram for explaining distribution of electrode finger pitches in a comparative example.

FIG. 2 is a diagram for explaining distribution of electrode finger pitches in a comparative example. On the lower side in FIG. 2, a top view of the parallel resonator P3 in the comparative example is illustrated, and on the upper side in FIG. 2, a graph showing the electrode finger pitches of the IDT electrode of the parallel resonator P3 in the comparative example is illustrated. For example, when the number of plurality of electrode fingers of the IDT electrode of the parallel resonator P3 is forty-two, the number of electrode finger pitches is forty-one. In FIG. 2, the forty-one electrode finger pitches are indicated by t1 to t41.

In the comparative example, the IDT electrode of the parallel resonator P3 does not have a plurality of different electrode finger pitches, but has the constant electrode finger pitches. As illustrated in Table 1 and FIG. 2, each of all the electrode finger pitches t1 to t41 is 1.6892 μm. Moreover, as illustrated in Table 1, the average of all the electrode finger pitches of the IDT electrode of the parallel resonator P3 is larger than the average of all the electrode finger pitches of the IDT electrode of the parallel resonator P2. Therefore, the resonant frequency of the parallel resonator P3 is lower than the resonant frequency of the parallel resonator P2.

Figure 3:
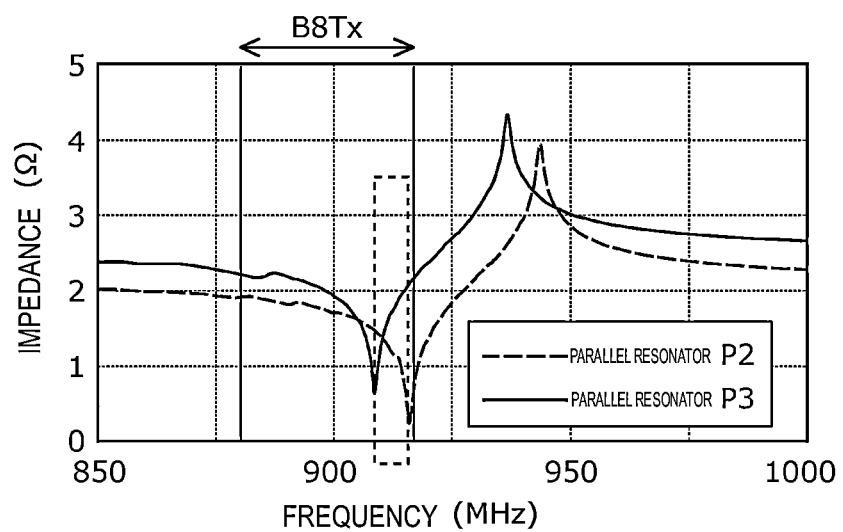
FIG. 3 is a graph illustrating impedance characteristics of a first parallel resonator and a second parallel resonator in the comparative example.

FIG. 3 is a graph illustrating impedance characteristics of the parallel resonators P2 and P3 in the comparative example. In FIG. 3, a solid line indicates impedance characteristics of the parallel resonator P3, and a broken line indicates impedance characteristics of the parallel resonator P2.

As described above, in the comparative example, the average of all the electrode finger pitches of the IDT electrode of the parallel resonator P3 is larger than the average of all the electrode finger pitches of the IDT electrode of the parallel resonator P2. Therefore, it can be seen that the resonant frequency of the parallel resonator P3 is lower than the resonant frequency of the parallel resonator P2. An acoustic wave resonator becomes inductive in a frequency band between its resonant frequency and its anti-resonant frequency, and becomes capacitive in a frequency band lower than the resonant frequency and a frequency band higher than the anti-resonant frequency. In the pass band of the filter 40 (for example, Band 8 Tx) positioned on the lower side of the pass band of the filter 10, the parallel resonator P2 becomes capacitive, and the parallel resonator P3 becomes inductive. That is, in a band indicated by a broken-line frame in FIG. 3, the parallel resonator P2 becomes capacitive, and the parallel resonator P3 becomes inductive, which leads to occurrence of LC resonance. When the LC resonance is caused in the filter 10 of the multiplexer 50, impedance of the filter 10 may approach 50Ω in the pass band of the filter 40 which is connected in common to the filter 10 (that is, return loss in the pass band of the filter 40 may increase). Therefore, there is a problem that attenuation of the filter 10 in its attenuation band corresponding to the pass band of the filter 40 may decrease.

Therefore, in this preferred embodiment, the IDT electrode of the parallel resonator P3 has a plurality of different electrode finger pitches.

3. Preferred Embodiment

Next, this preferred embodiment in which the IDT electrode of the parallel resonator P3 has a plurality of different electrode finger pitches is described.

Table 2 is a table showing parameters of the parallel resonators P1, P2, and P3 in this preferred embodiment.

TABLE 2

| Parallel resonator | Average pitch | Pitch distribution | Electrostatic capacitance |
| --- | --- | --- | --- |
| P1 | 1.6778 μm | Constant | 3.06 pF |
| P2 | 1.6759 μm | Constant | 1.17 pF |
| P3 | 1.6975 μm | Different | 0.51 pF |

As illustrated in Table 2, in this preferred embodiment, an average of all the electrode finger pitches of the IDT electrode of the parallel resonator P1 is 1.6778 μm, distribution of the electrode finger pitches of the IDT electrode of the parallel resonator P1 is constant, and an electrostatic capacitance of the parallel resonator P1 is 3.06 pF. An average of all the electrode finger pitches of the IDT electrode of the parallel resonator P2 is 1.6759 μm, distribution of the electrode finger pitches of the IDT electrode of the parallel resonator P2 is constant, and an electrostatic capacitance of the parallel resonator P2 is 1.17 pF. An average of all the electrode finger pitches of the IDT electrode of the parallel resonator P3 is 1.6975 μm, distribution of the electrode finger pitches of the IDT electrode of the parallel resonator P3 is different (that is, the IDT electrode of the parallel resonator P3 has a plurality of different electrode finger pitches), and an electrostatic capacitance of the parallel resonator P3 is 0.51 pF.

Figure 4:
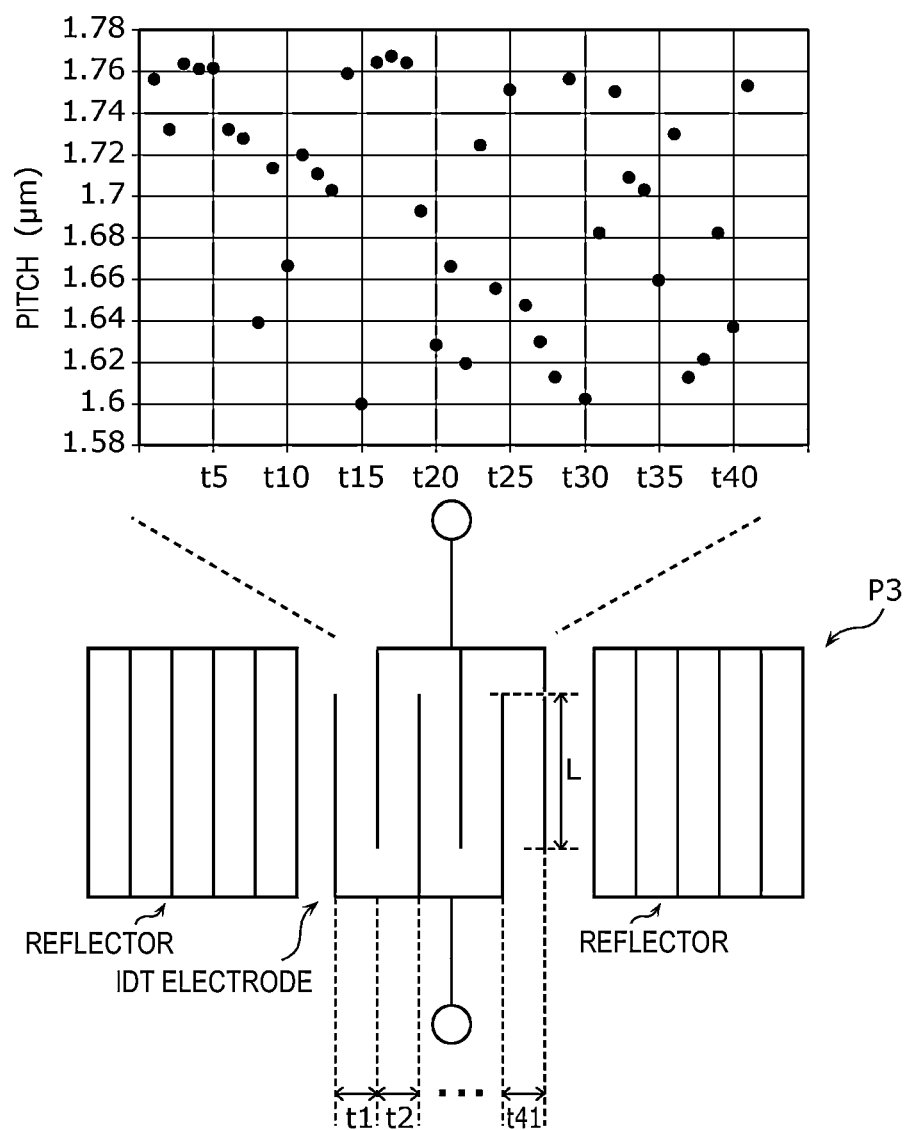
FIG. 4 is a diagram for explaining a distribution of electrode finger pitches in a preferred embodiment of the present invention.

FIG. 4 is a diagram for explaining distribution of electrode finger pitches in this preferred embodiment. On the lower side in FIG. 4, a top view of the parallel resonator P3 in this preferred embodiment is illustrated, and on the upper side in FIG. 4, a graph showing the electrode finger pitches of the IDT electrode of the parallel resonator P3 in this preferred embodiment is illustrated. For example, when the number of plurality of electrode fingers of the IDT electrode of the parallel resonator P3 is forty-two, the number of electrode finger pitches is forty-one. In FIG. 4, the forty-one electrode finger pitches are indicated by t1 to t41.

In this preferred embodiment, the IDT electrode of the parallel resonator P3 has a plurality of electrode finger pitches different from each other. In detail, the plurality of different electrode finger pitches of the IDT electrode of the parallel resonator P3 are made different from each other without regularity, and the electrode finger pitches adjacent to each other in the IDT electrode of the parallel resonator P3 are different from each other. FIG. 4 shows that the electrode finger pitches t1 to t41 are different from each other without regularity, and the electrode finger pitches adjacent to each other are different from each other (for example, the electrode finger pitch t1 and the electrode finger pitch t2 are different from each other, the electrode finger pitch t2 and the electrode finger pitch t3 are different from each other, . . . , and the electrode finger pitch t40 and the electrode finger pitch t41 are different from each other). Therefore, a plurality of resonance points are generated in the parallel resonator P3, and the parallel resonator P3 has a plurality of resonant frequencies. Moreover, as illustrated in Table 2, the average of all the electrode finger pitches of the IDT electrode of the parallel resonator P3 is larger than the average of all the electrode finger pitches of the IDT electrode of the parallel resonator P2. Therefore, the average frequency of the plurality of resonant frequencies of the parallel resonator P3 is lower than the resonant frequency of the parallel resonator P2.

Further, as illustrated in Table 2, the electrostatic capacitance of the parallel resonator P3 is smaller than the electrostatic capacitance of the parallel resonator P2. The electrostatic capacitance is a value in proportion to parameters including the number of pairs, an intersecting width, and a duty ratio of the IDT electrode. Thus, by adjusting these parameters, the electrostatic capacitance of the parallel resonator P3 can be made smaller than the electrostatic capacitance of the parallel resonator P2. For example, a product of an intersecting width of the IDT electrode of the parallel resonator P3 and a value obtained by subtracting one from the number of electrode fingers of the concerned IDT electrode is smaller than a product of an intersecting width of the IDT electrode of the parallel resonator P2 and a value obtained by subtracting one from the number of electrode fingers of the concerned IDT electrode. The intersecting width is a length of a portion where a plurality of electrode fingers overlap with each other when the plurality of electrode fingers of the IDT electrode are seen from the propagation direction of the acoustic wave (indicated by L in FIG. 4).

Figure 5:
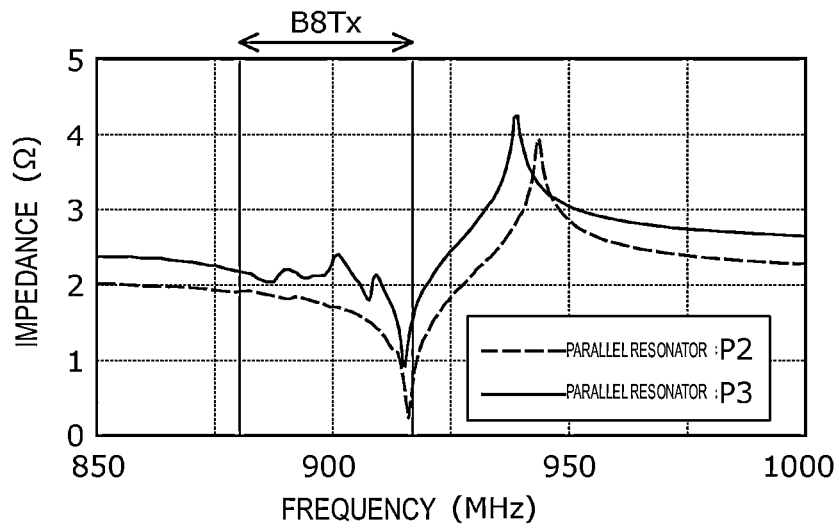
FIG. 5 is a graph illustrating impedance characteristics of a first parallel resonator and a second parallel resonator in a preferred embodiment of the present invention.

FIG. 5 is a graph illustrating impedance characteristics of parallel resonators P2 and P3 in this preferred embodiment. In FIG. 5, a solid line indicates impedance characteristics of the parallel resonator P3, and a broken line indicates impedance characteristics of the parallel resonator P2.

As described above, in this preferred embodiment, the IDT electrode of the parallel resonator P3 has the plurality of different electrode finger pitches, and thus, it can be seen that a plurality of resonance points are generated in the parallel resonator P3. On the other hand, one anti-resonance point corresponds to the average of all the electrode finger pitches of the IDT electrode of the parallel resonator P3. Moreover, the average of all the electrode finger pitches of the IDT electrode of the parallel resonator P3 is larger than the average of all the electrode finger pitches of the IDT electrode of the parallel resonator P2, and thus, it can be seen that the average frequency of the plurality of resonant frequencies of the parallel resonator P3 is lower than the resonant frequency of the parallel resonator P2. When an acoustic wave resonator has a plurality of resonant frequencies, the acoustic wave resonator becomes inductive in a frequency band between a resonant frequency on the highest frequency side among the plurality of resonant frequencies and an anti-resonant frequency, and becomes capacitive in a frequency band lower than the resonant frequency on the highest frequency side. By adjusting the average of all the electrode finger pitches, the anti-resonant frequency can be set to a desired frequency, and by making the electrode finger pitches different from each other, the band where the parallel resonator P3 becomes inductive can be made narrower. Thus, even when the parallel resonators P2 and P3 are connected in parallel, LC resonance is unlikely to occur, and it can be prevented that the impedance of the filter 10 approaches 50Ω in the pass band of the filter 40 which is connected in common to the filter 10. That is, return loss in the pass band of the filter 40 can be reduced. Therefore, a decrease in attenuation of the filter 10 in its attenuation band corresponding to the pass band of the filter 40 when the filter 10 is connected in common with the filter 40 can be reduced or prevented.

As illustrated in FIG. 5, a difference between the resonant frequency on the highest frequency side among the plurality of resonant frequencies of the parallel resonator P3 and the resonant frequency of the parallel resonator P2 is smaller than a difference between the anti-resonant frequency of the parallel resonator P3 and the anti-resonant frequency of the parallel resonator P2. In detail, the resonant frequency on the highest frequency side among the plurality of resonant frequencies of the parallel resonator P3 matches the resonant frequency of the parallel resonator P2. Therefore, the band where the LC resonance occurs can be made further narrower, and the return loss in the pass band of the filter 40 can be further reduced. Note that "match" does not need to be an "exact match", but may be a "substantial match". For example, when the resonant frequency on the highest frequency side among the plurality of resonant frequencies of the parallel resonator P3 is different from the resonant frequency of the parallel resonator P2 by several precent, these frequencies are regarded to be matched. Further, the difference is a value obtained by subtracting a smaller value from a larger value among the two values.

4. Comparison Between Preferred Embodiment and Comparative Example

Next, this preferred embodiment and the comparative example are compared to describe that decrease in attenuation of the filter 10 in the attenuation band corresponding to the pass band of the filter 40 when the filter 10 is connected in common with the filter 40 can be suppressed in this preferred embodiment.

Figure 6:
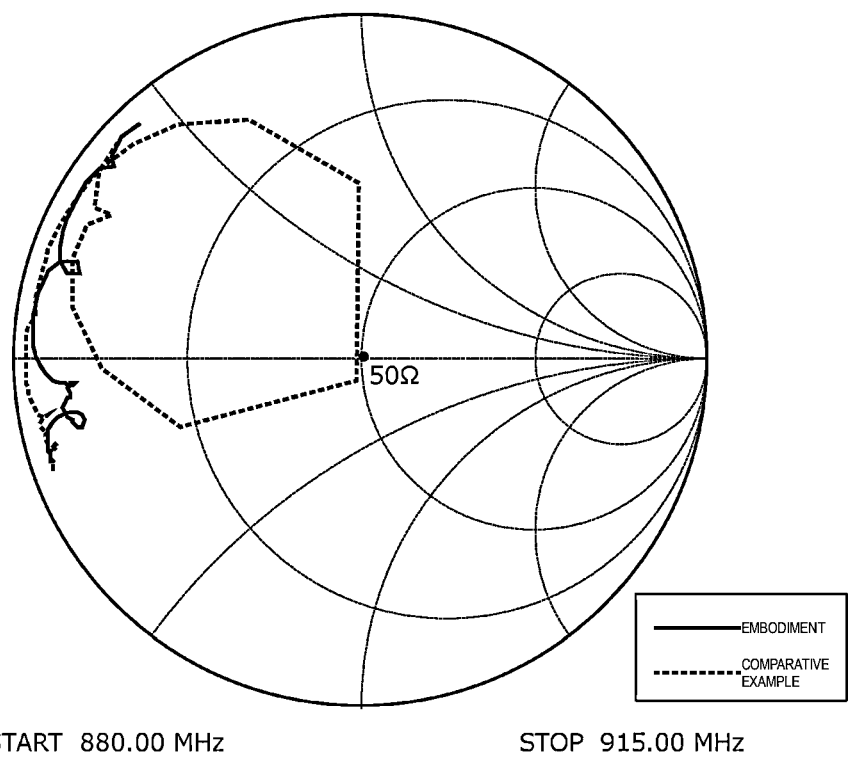
FIG. 6 is a Smith chart illustrating the impedance characteristics when seen from a first input-and-output terminal of an acoustic wave filter according to a preferred embodiment of the present invention and the comparative example.

FIG. 6 is a Smith chart illustrating impedance characteristics when seen from the input-and-output terminal 110 of the filter 10 in this preferred embodiment and the comparative example. In FIG. 6, a solid line indicates impedance characteristics in this preferred embodiment, and a broken line indicates impedance characteristics in the comparative example.

As illustrated in FIG. 6, in the comparative example, impedance seen from the input-and-output terminal 110 of the filter 10 in the pass band (880-915 MHz) of the filter 40 approaches 50Ω. On the other hand, in this preferred embodiment, it can be seen that impedance seen from the input-and-output terminal 110 of the filter 10 in the pass band of the filter 40 can be separated from 50 Ω.

Figure 7:
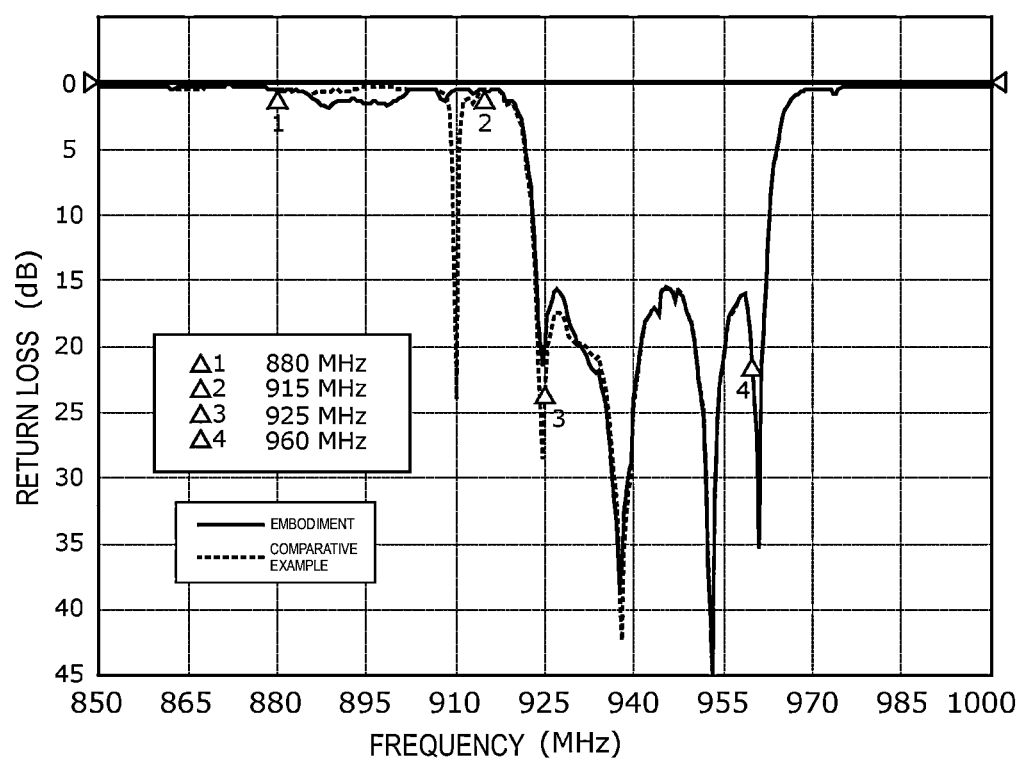
FIG. 7 is a graph illustrating return-loss characteristics when seen from the first input-and-output terminal of an acoustic wave filter according to a preferred embodiment and the comparative example.

FIG. 7 is a graph illustrating return-loss characteristics when seen from the input-and-output terminal 110 of the filter 10 in this preferred embodiment and the comparative example. In FIG. 7, a solid line indicates return-loss characteristics in this preferred embodiment, and a broken line indicates return-loss characteristics in the comparative example.

As illustrated in FIG. 7, in the comparative example, the maximum value of the return loss when seen from the input-and-output terminal 110 of the filter 10 in the pass band of the filter 40 (880-915 MHz: a frequency band between Marker 1 and Marker 2) is large at 22.6 dB. On the other hand, in this preferred embodiment, it can be seen that the maximum value of the return loss when seen from the input-and-output terminal 110 of the filter 10 in the pass band of the filter 40 can be made smaller at 1.8 dB. The amplifier 20 (low noise amplifier) is connected to the input-and-output terminal 110 of the filter 10 (reception filter). Therefore, when the return loss seen from the input-and-output terminal 110 of the filter 10 in the pass band of the filter 40 is large as in the comparative example, noise caused by a transmission signal from the filter 40 is also amplified by the amplifier 20, which degrades receiver sensitivity. However, in this preferred embodiment, the return loss is small, and thus, preferable receiver sensitivity can be achieved.

Figure 8:
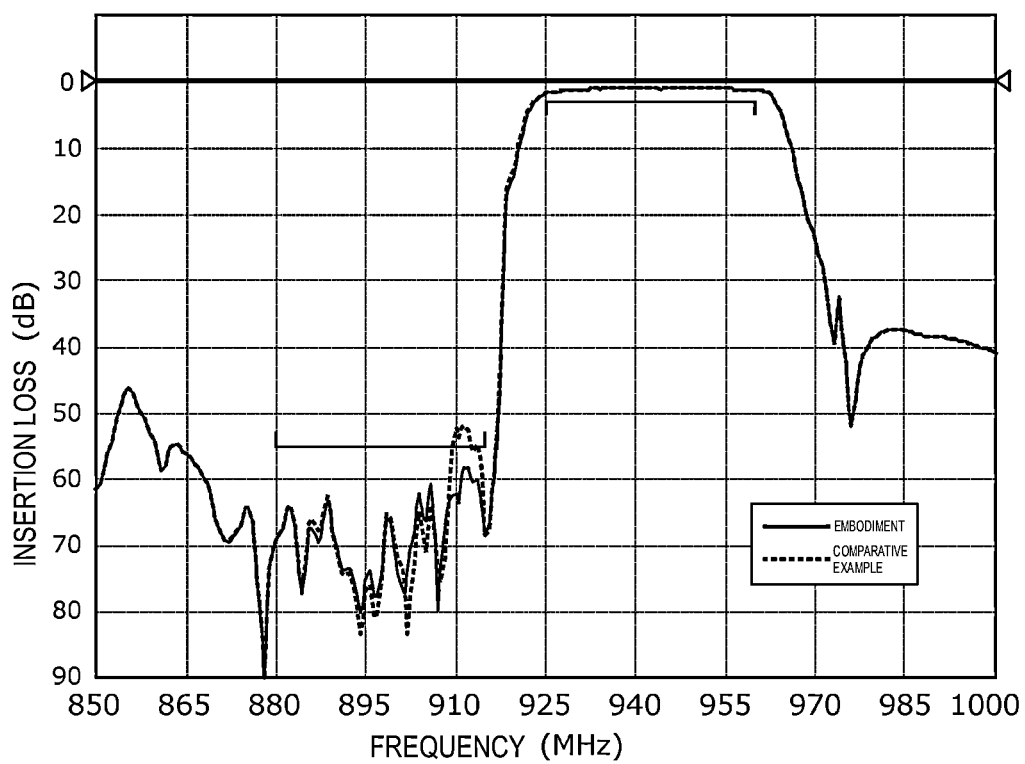
FIG. 8 is a graph illustrating filter characteristics of an acoustic wave filter according to a preferred embodiment of the present invention and the comparative example.

FIG. 8 is a graph illustrating filter characteristics of the filter 10 in this preferred embodiment and the comparative example. A solid line indicates filter characteristics in this preferred embodiment, and a broken line indicates filter characteristics in the comparative example.

As illustrated in FIG. 8, in the comparative example, the minimum value of attenuation of the filter 10 in the attenuation band corresponding to the pass band of the filter 40 is 51.9 dB. On the other hand, in this preferred embodiment, it can be seen that the minimum value of attenuation of the filter 10 in the attenuation band corresponding to the pass band of the filter 40 can be made larger at 58.0 dB.

5. Summary

As described above, the filter 10 includes the input-and-output terminal 110, the input-and-output terminal 120, the series resonator or the longitudinally coupled resonator (here, the series resonators S1 and S2 and the longitudinally coupled resonator D1) disposed on the path connecting the input-and-output terminal 110 and the input-and-output terminal 120, and the plurality of parallel resonators (here, the parallel resonators P1, P2, and P3) each connected between the path and the ground. Among the plurality of parallel resonators, the parallel resonator P3 and the parallel resonator P2 are connected in parallel without another resonator being interposed therebetween. Each of the parallel resonator P2 and the parallel resonator P3 includes the IDT electrode including the plurality of electrode fingers extending in the direction intersecting with the propagation direction of the acoustic wave and parallel or substantially parallel with each other. The IDT electrode of the parallel resonator P3 has the plurality of electrode finger pitches different from each other. The average of all the electrode finger pitches of the IDT electrode of the parallel resonator P3 is larger than the average of all the electrode finger pitches of the IDT electrode of the parallel resonator P2.

Since the IDT electrode of the parallel resonator P3 has the plurality of different electrode finger pitches, a plurality of resonance points are generated in the parallel resonator P3, and the parallel resonator P3 has the plurality of resonant frequencies. Further, the average frequency of the plurality of resonant frequencies of the parallel resonator P3 is lower than the average of one or more resonant frequencies of the parallel resonator P2, and the lower end of the inductive band of the parallel resonator P3 is positioned on a higher side when compared with the case where the electrode finger pitches are constant. Thus, the inductive band of the parallel resonator P3 becomes narrower. Therefore, even when the parallel resonators P2 and P3 are connected in parallel, LC resonance is unlikely to occur, and it can be prevented that the impedance of the filter 10 approaches 50Ω in the pass band of the filter 40 which is connected in common to the filter 10. That is, return loss in the pass band of the filter 40 can be reduced. Thus, a decrease in attenuation of the filter 10 in its attenuation band corresponding to the pass band of the filter 40 when the filter 10 is connected in common with the filter 40 can be reduced or prevented. Moreover, the resonant frequencies of the respective parallel resonators P2 and P3 which are connected in parallel (for example, parallelly divided) without intervention of another resonator are made different from each other. Thus, sharpness of the transition band from the pass band to the stop band is large, and the acoustic wave filter with a narrow pass band can be achieved. Note that when the parallel resonators P2 and P3 are parallelly connected with another resonator (for example, a series resonator) being interposed therebetween, interaction therebetween is reduced, and the sharpness cannot be increased sufficiently.

Note that such effects can be achieved when the IDT electrode of the parallel resonator P3 among the parallel resonators P2 and P3 connected in parallel has the plurality of different electrode finger pitches. The effects cannot be achieved even if the IDT electrode of the parallel resonator which is not connected in parallel (for example, the parallel resonator P1) has a plurality of different electrode finger pitches.

For example, the electrostatic capacitance of the parallel resonator P3 may be smaller than the electrostatic capacitance of the parallel resonator P2. In detail, the product of the intersecting width of the IDT electrode of the parallel resonator P3 and the value obtained by subtracting one from the number of electrode fingers of the concerned IDT electrode may be smaller than the product of the intersecting width of the IDT electrode of the parallel resonator P2 and the value obtained by subtracting one from the number of electrode fingers of the concerned IDT electrode.

In this configuration, the anti-resonance point of the parallel resonator P3 defines the lower side of the pass band of the filter 10, and impedance at the anti-resonance point of the parallel resonator P3 increases as the electrostatic capacitance of the parallel resonator P3 is small. Therefore, deterioration in insertion loss on the lower side of the pass band of the filter 10 can be reduced or prevented.

For example, the difference between the resonant frequency on the highest frequency side among the plurality of resonant frequencies of the parallel resonator P3 and the resonant frequency of the parallel resonator P2 may be smaller than the difference between the anti-resonant frequency of the parallel resonator P3 and the anti-resonant frequency of the parallel resonator P2.

The frequency band between the resonant frequency on the highest frequency side among the plurality of resonant frequencies of the parallel resonator P3 and the resonant frequency of the parallel resonator P2 is a band in which the band where the parallel resonator P3 becomes inductive and the band where parallel resonator P2 becomes capacitive overlap with each other (that is, the band where LC resonance occurs). Therefore, by the difference between the resonant frequency on the highest frequency side among the plurality of resonant frequencies of the parallel resonator P3 and the resonant frequency of the parallel resonator P2 being made smaller, the band where the LC resonance occurs can be made narrower, and the return loss in the pass band of the filter 40 can be reduced. Thus, a decrease in attenuation of the filter 10 in its attenuation band corresponding to the pass band of the filter 40 when the filter 10 is connected in common with the filter 40 can be reduced or prevented.

For example, the resonant frequency on the highest frequency side among the plurality of resonant frequencies of the parallel resonator P3 may match the resonant frequency of the parallel resonator P2.

As described above, the frequency band between the resonant frequency on the highest frequency side among the plurality of resonant frequencies of the parallel resonator P3 and the resonant frequency of the parallel resonator P2 is the band where LC resonance occurs. Therefore, by the resonant frequency on the highest frequency side among the plurality of resonant frequencies of the parallel resonator P3 being matched with the resonant frequency of the parallel resonator P2, the band where the LC resonance occurs can be made further narrower, and the return loss in the pass band of the filter 40 can be further reduced. Thus, a decrease in attenuation of the filter 10 in its attenuation band corresponding to the pass band of the filter 40 when the filter 10 is connected in common with the filter 40 can be further reduced or prevented.

For example, the plurality of different electrode finger pitches of the IDT electrode of the parallel resonator P3 may be made different from each other without regularity, and the electrode finger pitches adjacent to each other in the IDT electrode of the parallel resonator P3 may be different from each other.

When a ripple occurs between the plurality of resonance points caused in the parallel resonator P3, attenuation of the filter 10 in the attenuation band decreases. In this respect, the plurality of electrode finger pitches of the IDT electrode of the parallel resonator P3 are made different from each other without regularity, and the electrode finger pitches adjacent to each other in the IDT electrode of the parallel resonator P3 are made different from each other. Thus, the number of resonance points caused in the parallel resonator can be increased, and the ripple that occurs between the resonance points can be reduced.

For example, the electrode finger pitches of the IDT electrode of the parallel resonator P2 may be constant.

When the IDT electrode of the parallel resonator P2 has a plurality of different electrode finger pitches, a plurality of resonance points are generated in the parallel resonator P2, and the resonance point of the parallel resonator P2 occurs on the higher frequency side compared with the case where the electrode finger pitches are constant, which widens the capacitive band of the parallel resonator P2 (that is, the band where LC resonance occurs becomes wider). Therefore, return loss in the pass band of the filter 40 increases. In this respect, by the electrode finger pitches of the IDT electrode of the parallel resonator P2 being made constant, the return loss in the pass band of the filter 40 can be reduced.

The high frequency module 30 includes the filter 10, and the amplifier 20 connected to the input-and-output terminal 110.

In this configuration, there can be provided that the high frequency module 30 having a large sharpness of the transition band from the pass band to the stop band, and capable of reducing or preventing a decrease in attenuation of the filter 10 in the attenuation band corresponding to the pass band of the filter 40 when the filter 10 is connected with the filter 40.

The multiplexer 50 includes the common terminal 150, the filter 10, and the filter 40 including the input-and-output terminals 130 and 140 and having the pass band different from the pass band of the filter 10. The common terminal 150 is connected to the input-and-output terminals 120 and 140.

In this configuration, the multiplexer 50 having a large sharpness of the transition band from the pass band to the stop band, and capable of reducing or preventing a decrease in attenuation of the filter 10 in the attenuation band corresponding to the pass band of the filter 40 can be provided.

For example, the filter 10 may be a reception filter, the filter 40 may be a transmission filter. The pass band of the filter 10 may be positioned on a higher frequency side of the pass band of the filter 40.

In this configuration, a decrease in attenuation of the filter 10 in the attenuation band on the lower side of the pass band can be reduced or prevented, and receiver sensitivity of the filter 10 can be improved.

OTHER PREFERRED EMBODIMENTS

Although the filter 10, the high frequency module 30, and the multiplexer 50 according to the preferred embodiments of the present invention are described above, the present invention also includes other preferred embodiments embodied by combining arbitrary components of the above-described preferred embodiments, and modifications achieved by applying various changes conceived by a person having ordinary skill in the art to the above-described preferred embodiments within a scope without departing from the spirit of the present invention.

For example, in the preferred embodiments, a case is described where the electrostatic capacitance of the parallel resonator P3 is smaller than the electrostatic capacitance of the parallel resonator P2. However, the electrostatic capacitance of the parallel resonator P3 may be larger than the electrostatic capacitance of the parallel resonator P2.

For example, in the preferred embodiments, a case is described where the difference between the resonant frequency on the highest frequency side among the plurality of resonant frequencies of the parallel resonator P3 and the resonant frequency of the parallel resonator P2 is smaller than the difference between the anti-resonant frequency of the parallel resonator P3 and the anti-resonant frequency of the parallel resonator P2. However, the difference between the resonant frequency on the highest frequency side among the plurality of resonant frequencies of the parallel resonator P3 and the resonant frequency of the parallel resonator P2 may be larger than the difference between the anti-resonant frequency of the parallel resonator P3 and the anti-resonant frequency of the parallel resonator P2.

For example, in the preferred embodiments, a case is described where the plurality of different electrode finger pitches of the IDT electrode of the parallel resonator P3 are made different from each other without regularity, and the electrode finger pitches adjacent to each other in the IDT electrode of the parallel resonator P3 are different from each other. However, the electrode finger pitches may be made different from each other with regularity, and the IDT electrode of the parallel resonator P3 may have the same electrode finger pitches adjacent to each other.

For example, in the preferred embodiments, a case is described where the electrode finger pitches of the IDT electrode of the parallel resonator P2 are constant. However, the IDT electrode of the parallel resonator P2 may have a plurality of different electrode finger pitches.

Preferred embodiments of the present invention can widely be utilized in communication devices such as cellular phones, as an acoustic wave filter, a high frequency module, and a multiplexer which are applicable to a multiband system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
a first input-and-output terminal;
a second input-and-output terminal;
a series resonator or a longitudinally coupled resonator on a path connecting the first input-and-output terminal and the second input-and-output terminal; and
a plurality of parallel resonators each connected between the path and a ground; wherein
among the plurality of parallel resonators, a first parallel resonator and a second parallel resonator are connected in parallel without another resonator being interposed therebetween;
each of the first parallel resonator and the second parallel resonator includes an IDT electrode including a plurality of electrode fingers extending in a direction intersecting with a propagation direction of an acoustic wave and positioned in parallel or substantially in parallel with each other;
the IDT electrode of the first parallel resonator includes a plurality of electrode finger pitches different from each other; and
an average of all the electrode finger pitches of the IDT electrode of the first parallel resonator is larger than an average of all electrode finger pitches of the IDT electrode of the second parallel resonator.

2. The acoustic wave filter according to claim 1, wherein an electrostatic capacitance of the first parallel resonator is smaller than an electrostatic capacitance of the second parallel resonator.

3. The acoustic wave filter according to claim 1, wherein a product of an intersecting width of the IDT electrode of the first parallel resonator and a value obtained by subtracting one from a number of electrode fingers of the IDT electrode of the first parallel resonator is smaller than a product of an intersecting width of the IDT electrode of the second parallel resonator and a value obtained by subtracting one from a number of electrode fingers of the IDT electrode of the second parallel resonator.

4. The acoustic wave filter according to claim 1, wherein a difference between a resonant frequency on a highest frequency side among a plurality of resonant frequencies of the first parallel resonator and a resonant frequency of the second parallel resonator is smaller than a difference between an anti-resonant frequency of the first parallel resonator and an anti-resonant frequency of the second parallel resonator.

5. The acoustic wave filter according to claim 4, wherein the resonant frequency on the highest frequency side among the plurality of resonant frequencies of the first parallel resonator matches the resonant frequency of the second parallel resonator.

6. The acoustic wave filter according to claim 1, wherein the plurality of different electrode finger pitches of the IDT electrode of the first parallel resonator are irregularly different, and the electrode finger pitches adjacent to each other in the IDT electrode of the first parallel resonator are different from each other.

7. The acoustic wave filter according to claim 1, wherein the electrode finger pitches of the IDT electrode of the second parallel resonator are constant.

8. A high frequency module comprising:
   the acoustic wave filter according to claim 1; and
   an amplifier connected to the first input-and-output terminal.

9. The high frequency module according to claim 8, wherein an electrostatic capacitance of the first parallel resonator is smaller than an electrostatic capacitance of the second parallel resonator.

10. The high frequency module according to claim 8, wherein a product of an intersecting width of the IDT electrode of the first parallel resonator and a value obtained by subtracting one from a number of electrode fingers of the IDT electrode of the first parallel resonator is smaller than a product of an intersecting width of the IDT electrode of the second parallel resonator and a value obtained by subtracting one from a number of electrode fingers of the IDT electrode of the second parallel resonator.

11. The high frequency module according to claim 8, wherein a difference between a resonant frequency on a highest frequency side among a plurality of resonant frequencies of the first parallel resonator and a resonant frequency of the second parallel resonator is smaller than a difference between an anti-resonant frequency of the first parallel resonator and an anti-resonant frequency of the second parallel resonator.

12. The high frequency module according to claim 11, wherein the resonant frequency on the highest frequency side among the plurality of resonant frequencies of the first parallel resonator matches the resonant frequency of the second parallel resonator.

13. The high frequency module according to claim 8, wherein the plurality of different electrode finger pitches of the IDT electrode of the first parallel resonator are irregularly different, and the electrode finger pitches adjacent to each other in the IDT electrode of the first parallel resonator are different from each other.

14. The high frequency module according to claim 8, wherein the electrode finger pitches of the IDT electrode of the second parallel resonator are constant.

15. A multiplexer comprising:
   a common terminal;
   the acoustic wave filter according to claim 1; and
   a first filter including a third input-and-output terminal and a fourth input-and-output terminal and having a pass band different from a pass band of the acoustic wave filter; wherein
   the common terminal is connected to the second input-and-output terminal and the fourth input-and-output terminal.

16. The multiplexer according to claim 15, wherein
   the acoustic wave filter is a reception filter;
   the first filter is a transmission filter; and
   the pass band of the first filter is positioned on a lower frequency side of the pass band of the acoustic wave filter.

17. The multiplexer according to claim 15, wherein an electrostatic capacitance of the first parallel resonator is smaller than an electrostatic capacitance of the second parallel resonator.

18. The multiplexer according to claim 15, wherein a product of an intersecting width of the IDT electrode of the first parallel resonator and a value obtained by subtracting one from a number of electrode fingers of the IDT electrode of the first parallel resonator is smaller than a product of an intersecting width of the IDT electrode of the second parallel resonator and a value obtained by subtracting one from a number of electrode fingers of the IDT electrode of the second parallel resonator.

19. The multiplexer according to claim 15, wherein a difference between a resonant frequency on a highest frequency side among a plurality of resonant frequencies of the first parallel resonator and a resonant frequency of the second parallel resonator is smaller than a difference between an anti-resonant frequency of the first parallel resonator and an anti-resonant frequency of the second parallel resonator.

20. The multiplexer according to claim 19, wherein the resonant frequency on the highest frequency side among the plurality of resonant frequencies of the first parallel resonator matches the resonant frequency of the second parallel resonator.

* * * * *